United States Patent [19]
Hiraishi et al.

[11] Patent Number: 5,699,028
[45] Date of Patent: Dec. 16, 1997

[54] SURFACE ACOUSTIC-WAVE RESONATOR FILTER HAVING SHIFTED RESONANT FREQUENCIES

[75] Inventors: Akira Hiraishi; Katsuhiro Ikada, both of Kanazawa, Japan

[73] Assignee: Murata Manufacturing Co., Ltd.

[21] Appl. No.: 703,620

[22] Filed: Aug. 27, 1996

Related U.S. Application Data

[62] Division of Ser. No. 438,532, May 10, 1995, abandoned.

[30] Foreign Application Priority Data

May 11, 1994 [KR] Rep. of Korea ............... 6-097527

[51] Int. Cl.⁶ ..................................................... H03H 9/64
[52] U.S. Cl. ................. 333/195; 310/313 R; 310/313 D
[58] Field of Search ............................. 333/193–196; 310/313 R, 313 B, 313 C, 313 D

[56] References Cited

U.S. PATENT DOCUMENTS 5,223,762  6/1993  Masaie et al. .................. 333/195

FOREIGN PATENT DOCUMENTS

| | | |
|---|---|---|
| 155810 | 6/1988 | Japan . |
| 63-155810 | 6/1988 | Japan . |
| 0054805 | 3/1989 | Japan . |
| 1231417 | 9/1989 | Japan . |
| 162116 | 7/1991 | Japan . |
| 4081012 | 3/1992 | Japan . |
| 5129864 | 5/1993 | Japan . |
| 6244676 | 9/1994 | Japan . |
| 6276046 | 9/1994 | Japan . |

*Primary Examiner*—Benny Lee
*Attorney, Agent, or Firm*—Ostrolenk, Faber, Gerb & Soffen, LLP

[57] ABSTRACT

A surface acoustic-wave resonator filter having improved group delay time characteristics. The filter comprises three energy-confined acoustic-wave resonator filter sections formed on a piezoelectric substrate. The second resonator filter section is positioned between the first and third resonator filter sections. One frequency in a vertical higher-order mode of the second filter section is placed on the lower-frequency side of one frequency in a vertical higher-order mode of the first and third filter sections. Or, one frequency in a vertical lower-order mode of the second filter section is placed on the higher-frequency side of one frequency in a vertical lower-order mode of the first and third filter sections.

8 Claims, 8 Drawing Sheets

SURFACE ACOUSTIC-WAVE RESONATOR FILTER HAVING SHIFTED RESONANT FREQUENCIES

This is a Continuation of application Ser. No. 08/438,532, filed on May 10, 1995, now abandoned.

BACKGROUND OF THE INVENTION

1. Field of the Invention

The present invention relates to a surface acoustic-wave resonator filter comprising a plurality of energy-confined surface acoustic-wave (SAW) resonator filter sections connected in cascade on a piezoelectric substrate, each resonator filter section comprising reflector electrodes formed on opposite sides of at least two sets of interdigital electrodes.

2. Description of the Related Art

A prior art cascade-connected surface acoustic-wave resonator filter comprises at least two energy-confined SAW resonator filter sections connected in cascade on a piezoelectric substrate to obtain high selectivity characteristics. For example, as shown in FIG. 13, in each resonator filter section, reflector electrodes 11c and 11d are formed on opposite sides of at least two sets of interdigital electrodes 11a and 11b on the piezoelectric substrate 20. The passband is determined by the difference between the frequency in a higher-frequency oscillation mode (e.g., the oscillation frequency in the vertical zeroth-order mode) and the frequency in a lower-frequency oscillation mode (e.g., the oscillation frequency in a vertical higher-order mode).

Where three such resonator filter sections are connected in cascade to obtain higher selectivity characteristics, the first and third resonator filter sections are designed to have a wide passband. The second resonator filter section is designed to have a narrow passband. The narrow passband is included in the wide passband. In this way, a cascade-connected surface acoustic-wave resonator filter is fabricated.

The prior art cascade-connected surface acoustic-wave resonator filter provides low loss, has high selectivity characteristics, and is small in size. However, the flatness of the group delay time characteristics within a passband of 3 dB is poor.

SUMMARY OF THE INVENTION

Accordingly, it is an object of the present invention to provide a surface acoustic-wave resonator filter having improved group delay time characteristics.

The above object may be achieved by a surface acoustic-wave resonator filter comprising at least a first energy-confined surface acoustic-wave resonator filter section and a second energy-confined surface acoustic-wave resonator filter section which are connected in cascade on a piezoelectric substrate, each of said resonator filter sections comprising reflector electrodes disposed on opposite sides of at least two sets of interdigital electrodes, each of said resonator filter sections having a passband determined by the difference between a frequency in a higher-frequency oscillation mode and a frequency in a lower-frequency oscillation mode. This resonator filter is characterized in that the frequency in the lower-frequency oscillation mode of the second resonator filter section is placed on the lower-frequency side of the frequency in the lower-frequency oscillation mode of the first resonator filter section.

The above object may also be achieved by a surface acoustic-wave resonator filter comprising at least a first energy-confined surface acoustic-wave resonator filter section and a second energy-confined surface acoustic-wave resonator filter section which are connected in cascade on a piezoelectric substrate, each of said resonator filter sections comprising reflector electrodes disposed on opposite sides of at least two sets of interdigital electrodes, each of said resonator filter sections having a passband determined by the difference between a frequency in a higher-frequency oscillation mode and a frequency in a lower-frequency oscillation mode. This resonator filter is characterized in that the frequency in the higher-frequency oscillation mode of the second resonator filter section is placed on the higher-frequency side of the frequency in the higher-frequency oscillation mode of the first resonator filter section.

The above object may also be achieved by a surface acoustic-wave resonator filter comprising at least a first energy-confined surface acoustic-wave resonator filter section and a second energy-confined surface acoustic-wave resonator filter section which are connected in cascade on a piezoelectric substrate, each of said resonator filter sections comprising reflector electrodes disposed on opposite sides of at least two sets of interdigital electrodes, each of said resonator filter sections having a passband determined by the difference between a frequency in a higher-frequency oscillation mode and a frequency in a lower-frequency oscillation mode. This resonator filter is characterized in that the frequency in the lower-frequency oscillation mode of the second resonator filter section is placed on the lower-frequency side of the frequency in the lower-frequency oscillation mode of the first resonator filter section, and that the frequency in the higher-frequency oscillation mode of the second resonator filter section is placed on the higher-frequency side of the frequency in the higher-frequency oscillation mode of the first resonator filter section.

In one feature of the invention, each of these resonator filter sections connected in cascade is of the vertically or transversely coupled type.

In another feature of the invention, capacitors or inductors are interposed between said first and second resonator filter sections and electrically connected in parallel with these filter sections.

In the foregoing examples of the present invention, at least two resonator filter sections are connected in cascade to construct a surface acoustic-wave resonator filter. One oscillation frequency in a lower-frequency oscillation mode of the second resonator filter section may be positioned on the lower-frequency side of one oscillation frequency in a lower-frequency oscillation mode of the first resonator filter section. Alternatively, one oscillation frequency in a higher-frequency oscillation mode of the second resonator filter section may be placed on the higher-frequency side of one oscillation frequency in the higher-frequency oscillation mode of the first resonator filter. Consequently, the group delay time characteristics are improved at higher or lower frequencies within the passband.

Other objects and features of the invention will appear in the course of the description of embodiments thereof, which follows.

DETAILED DESCRIPTION OF THE PREFERRED EMBODIMENTS

Several preferred embodiments of the invention are hereinafter described with reference to the accompanying drawings.

Figure 1:
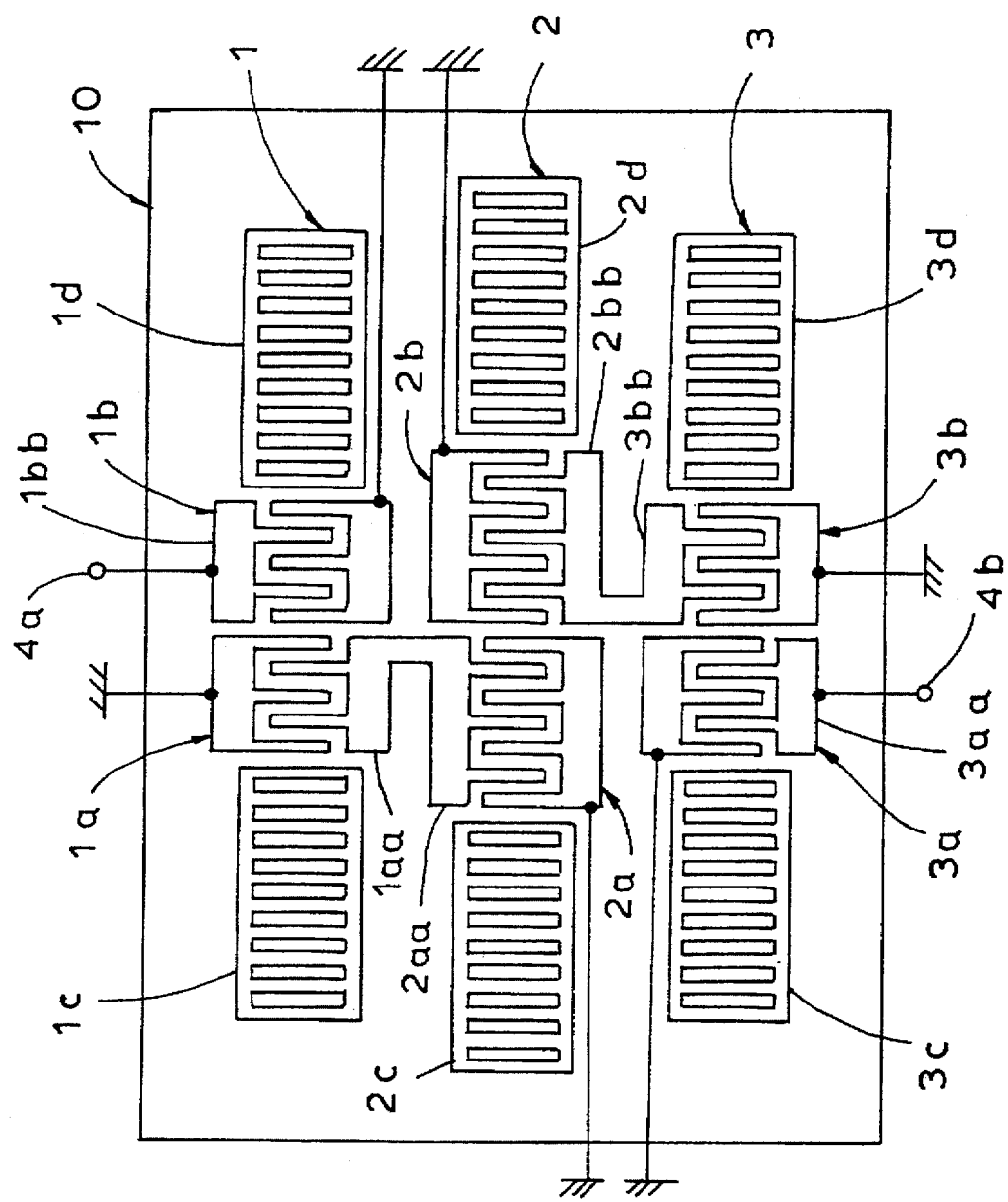
FIG. 1 is a schematic plan view of electrodes of a three-section cascade-connected SAW resonator filter according to a first embodiment of the present invention.

FIG. 1 is a schematic plan view of a surface acoustic-wave (SAW) resonator filter embodying the concept of the present invention. This resonator filter is composed of three resonator filter sections connected in cascade. This SAW resonator filter comprises a piezoelectric substrate 10, for example, made of X-cut LiTaO$_3$. The three resonator filter sections, indicated by numerals 1, 2, and 3, respectively, are formed on this substrate 10. Two sets of interdigital electrodes 1a and 1b are disposed close to each other in this resonator filter section 1. Reflector electrodes 1c and 1d are disposed outside the interdigital electrodes 1a and 1b. The resonator filter sections 2 and 3 are similar to the resonator filter section 1 in electrode configuration. That is, the resonator filter section 2 has interdigital electrodes 2a, 2b and reflector electrodes 2c, 2d. The resonator filter section 3 has interdigital electrodes 3a, 3b and reflector electrodes 3c, 3d.

The resonator filter section 1 having the two sets of interdigital electrodes 1a, 1b and the reflector electrodes 1c, 1d is made coincident in the number of interdigital electrodes, in the number of reflector electrodes, and in their shapes, with the resonator filter section 3 having the two sets of interdigital electrodes 3a, 3b and the reflector electrodes 3c, 3d, so that these two resonator filter sections agree in input/output impedance. When the SAW filter resonator is connected with an external circuit (not shown), the input and the output can be interchanged.

The resonator filter section 2 positioned in the center has the two sets of interdigital electrodes 2a and 2b which have more electrode pairs than the resonator filter sections 1 and 3, to obtain high selectivity characteristics.

The interdigital electrodes 1a and 2a of the resonator filter sections 1 and 2 which are close to each other are connected in cascade via their respective interdigital electrode terminals 1aa and 2aa. Also, the interdigital electrodes 2b and 3b of the resonator filter sections 2 and 3 which are close to each other are connected in cascade via their respective interdigital electrode terminals 2bb and 3bb. The interdigital electrodes 1b and 3a of the resonator filter sections 1 and 3 that are located on opposite sides have interdigital electrode terminals 1bb and 3aa, respectively, which are connected with input/output terminals 4a and 4b, respectively.

These interdigital electrodes, reflector electrodes, and interdigital electrode terminals are fabricated by metallizing the piezoelectric substrate 10 with aluminum (Al) and then photolithographically etching the metallization layer.

In the present example, the electrodes are arranged as outlined above. The present example may be employed in a 71 MHz-band IF filter used in a digital cellular telephone system such as GSM (Global System for Mobile Communication). Data about this application is listed in Table 1 below, together with data about the prior art structure, for comparison purposes. In the prior art structure, the number (or, three) of resonator filter sections connected in cascade is equal to the number of the resonator filter sections connected in cascade in the present example.

TABLE 1

|  | present example | prior art |
| --- | --- | --- |
| substrate material | X-cut LiTaO$_3$ | X-cut LiTaO$_3$ |
| interdigital electrodes of filter section 1 | 2 sets, each consisting of 37 pairs of interdigital electrodes | 2 sets, each consisting of 37 pairs of interdigital electrodes |
| interdigital electrodes of filter section 2 | 2 sets, each consisting of 41 pairs of interdigital electrodes | 2 sets, each consisting of 42 pairs of interdigital electrodes |
| interdigital electrodes of filter section 3 | 2 sets, each consisting of 37 pairs of interdigital electrodes | 2 sets, each consisting of 37 pairs of interdigital electrodes |
| number of reflector electrodes | 90 | 90 |

In order for the 3-section surface acoustic-wave resonator filter shown in FIG. 1 to have desired frequency characteristics, it is necessary to determine various dimensions and parameters (such as the wavelength ratio of the interdigital electrodes to the reflectors, the spacing between the adjacent interdigital electrodes, and the spacing between the interdigital electrodes and the adjacent reflector electrodes), in addition to the material and the parameters listed in Table 1.

Figure 2:
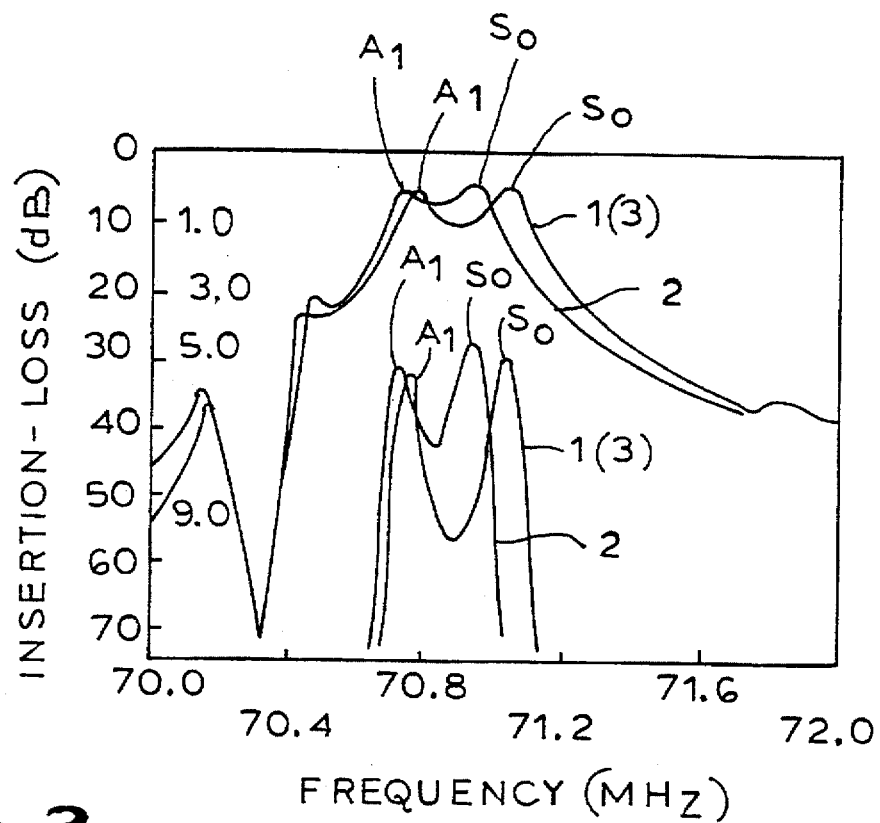
FIG. 2 is a graph illustrating a first arrangement of one frequency in the vertical zeroth-order mode and one frequency in the vertical first-order mode of the surface acoustic-wave resonator filter of FIG. 1.

In the present example, these dimensions and parameters are set to desired values so as to arrange one oscillation frequency S0 in the vertical zeroth-order mode and one oscillation frequency A1 in the vertical first-order mode of the resonator filter sections 1 and 3, and one oscillation frequency S0 in the vertical zeroth-order mode and one oscillation frequency A1 in the vertical first-order mode of the resonator filter section 2 as shown in FIG. 2. Specifically, the oscillation frequency A1 in the vertical first-order mode of the resonator filter section 2 is placed below, that is, on the lower-frequency side of, the oscillation frequency A1 in the vertical first-order mode of the resonator filter sections 1 and 3. In this way, the group delay time characteristics at lower frequencies within the passband are improved.

Figure 5:
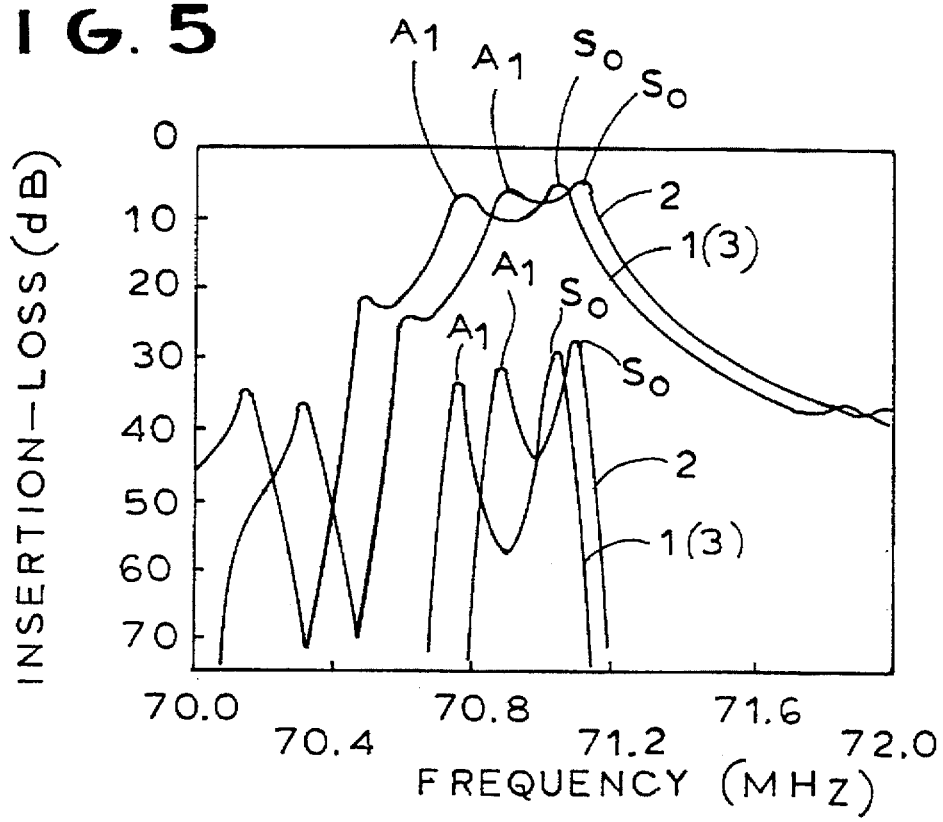
FIG. 5 is a graph showing a second arrangement of one frequency in the vertical zeroth-order mode and one frequency in the vertical first-order mode of the surface acoustic-wave resonator filter of FIG. 1.

Another example shown in FIG. 5 is a reversed version of the frequency arrangement of FIG. 2. That is, one oscillation frequency S0 in the vertical zeroth-order mode of the resonator filter section 2 is placed above, that is, on the higher-frequency side of, one oscillation frequency S0 in the vertical zeroth-order mode of the resonator filter sections 1 and 3. Thus, the group delay time characteristics at higher frequencies within the passband are improved.

Figure 6:
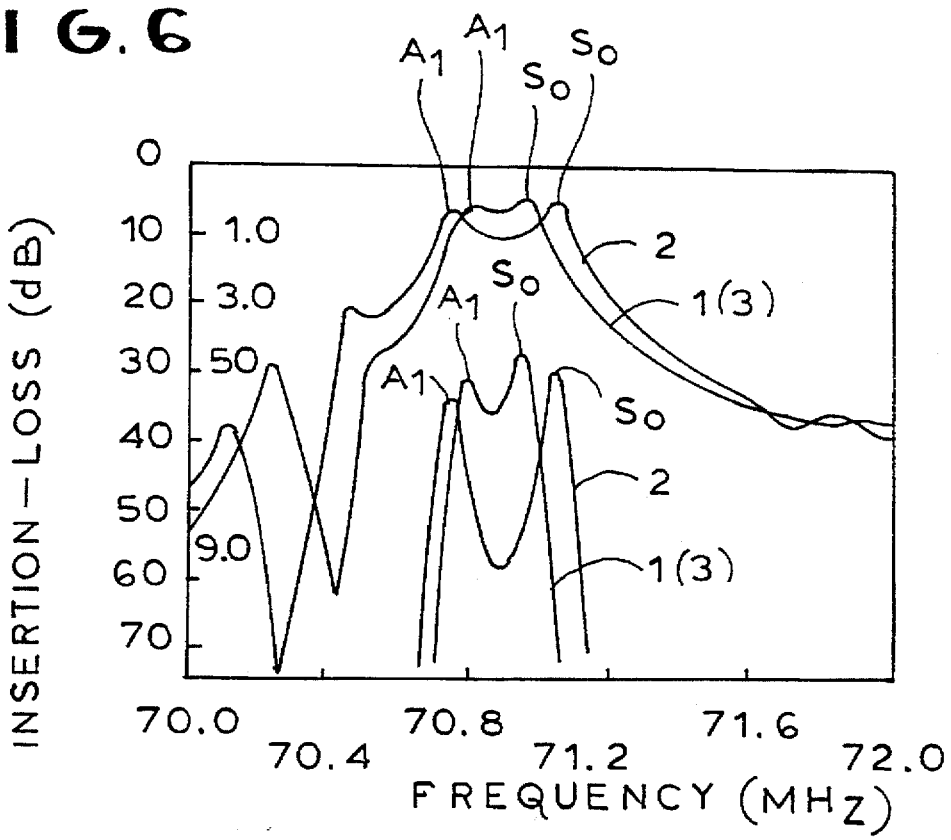
FIG. 6 is a graph showing a third arrangement of one frequency in the vertical zeroth-order mode and one frequency in the vertical first-order mode of the surface acoustic-wave resonator filter of FIG. 1.

The example shown in FIG. 2 can be combined with this second example shown in FIG. 5. That is, as shown in FIG. 6, one oscillation frequency A1 in the vertical first-order mode of the second resonator filter section 2 is placed on the lower-frequency side of one oscillation frequency A1 in the vertical first-order mode of the resonator filter sections 1 and 3. One oscillation frequency S0 in the vertical zeroth-order mode of the resonator filter section 2 is placed on the higher-frequency side of one oscillation frequency S0 in the vertical zeroth-order mode of the resonator filter sections 1 and 3. In this way, the group delay time characteristics at lower frequencies and at higher frequencies within the passband can be improved.

Figure 7:
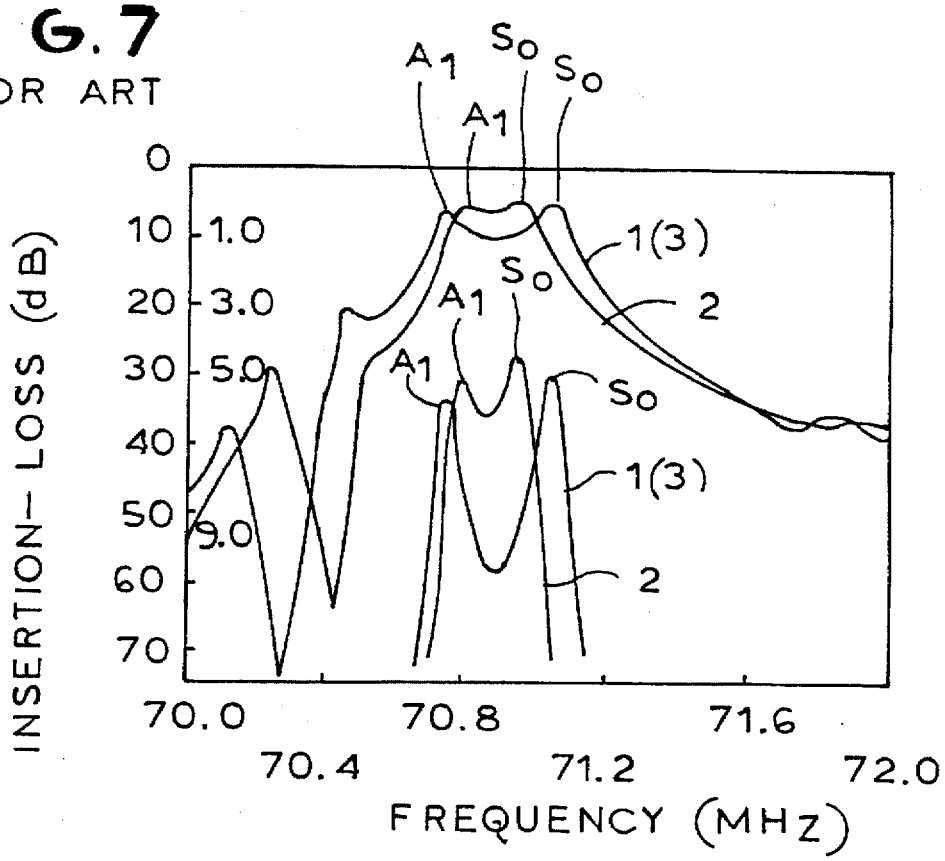
FIG. 7 is a graph showing an arrangement of one frequency in the vertical zeroth-order mode and one frequency in the vertical first-order mode of the prior art SAW resonator filter.

In the prior art structure, the frequencies are arranged as shown in FIG. 7. That is, one oscillation frequency A1 in the vertical first-order mode of the resonator filter section 2 is placed on the higher-frequency side of one oscillation frequency A1 in the vertical first-order mode of the resonator filter sections 1 and 3. One oscillation frequency S0 in the vertical zeroth-order mode of the resonator filter section 2 is placed on the lower-frequency side of one oscillation frequency S0 in the vertical zeroth-order mode of the resonator filter sections 1 and 3.

Figure 3:
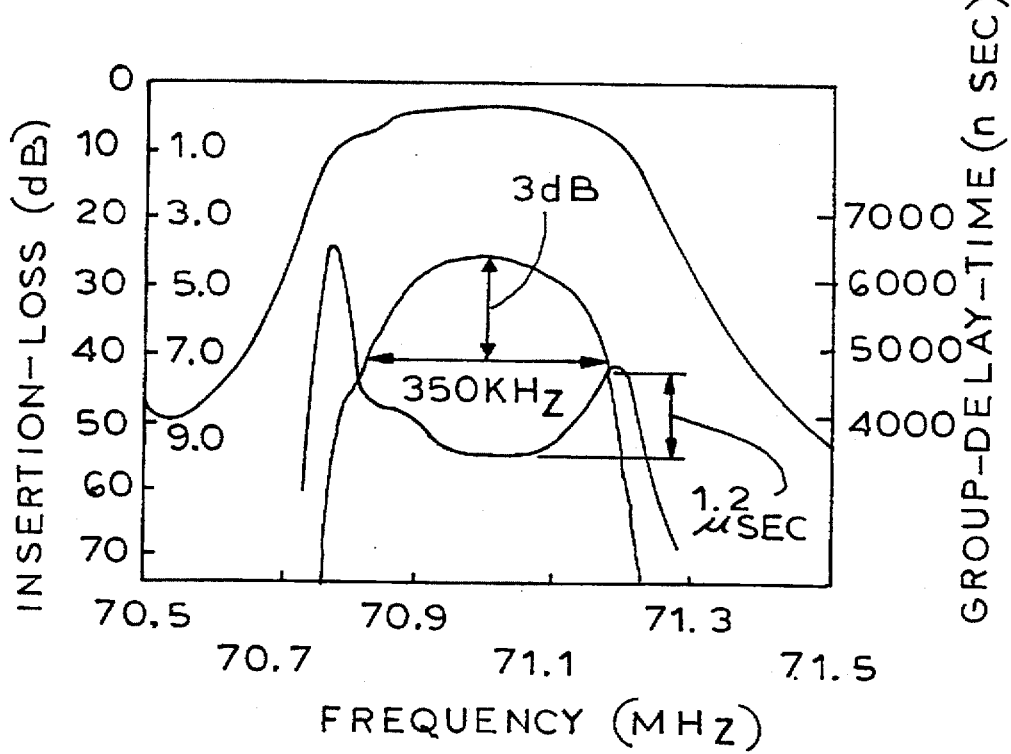
FIG. 3 is a graph showing filter characteristics inside the passband of a surface acoustic-wave resonator filter according to FIG. 2.
Figure 4:
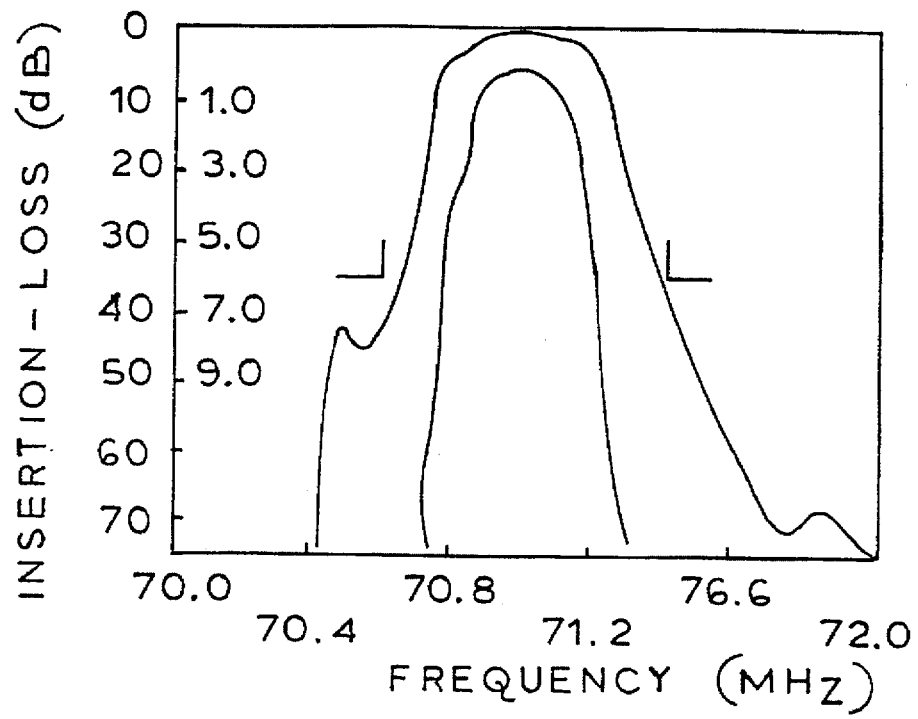
FIG. 4 is a graph showing filter characteristics outside the passband of the filter described in FIGS. 2 and 3.
Figure 8:
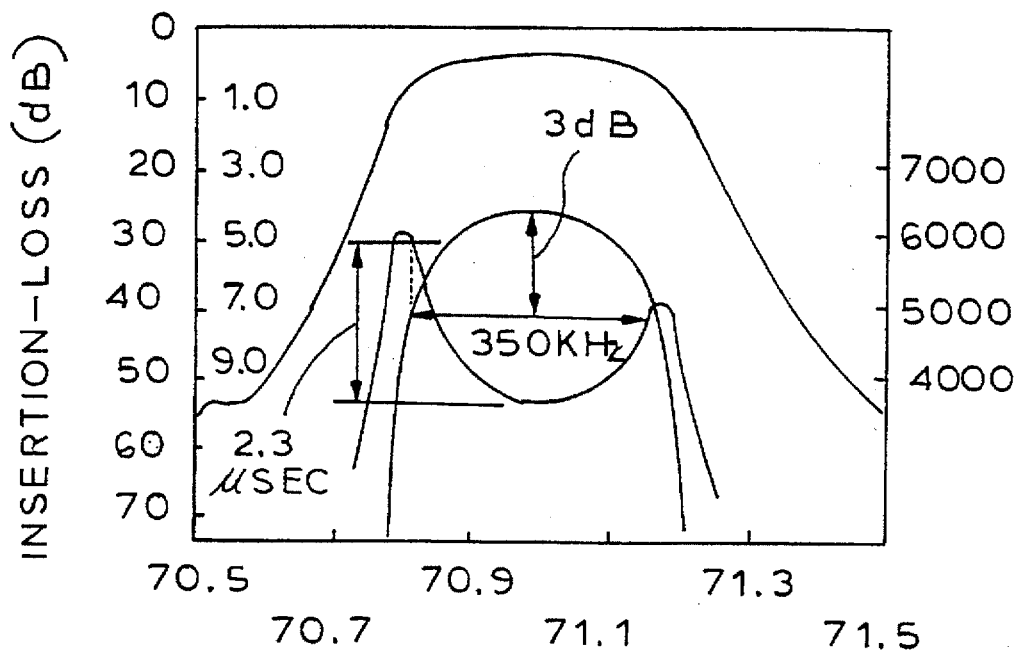
FIG. 8 is a graph showing filter characteristics inside the passband of the prior art surface acoustic-wave resonator filter.
Figure 9:
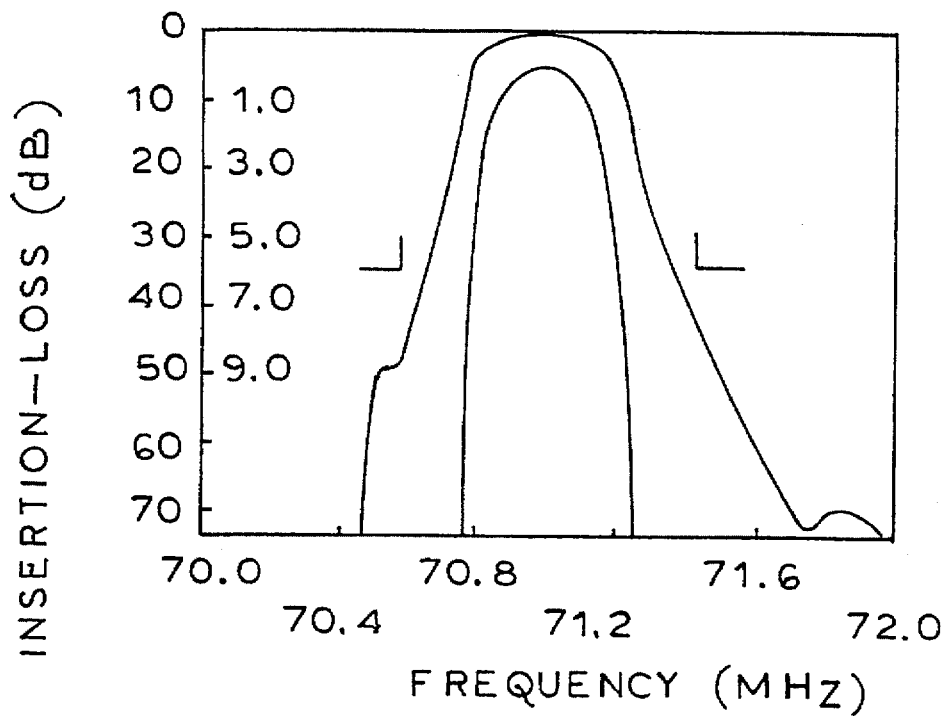
FIG. 9 is a graph showing filter characteristics outside the passband of the prior art surface acoustic-wave resonator filter.

FIG. 3 shows filter characteristics inside the passband of the present example. FIG. 4 shows the characteristics outside the passband of the present example. FIG. 8 shows the characteristics inside the passband of the prior art structure. FIG. 9 shows the characteristics outside the passband of the prior art structure.

In the present example shown in FIG. 3, the group delay time within the passband of 3 dB is 1.2 μsec, which is a great improvement over the group delay time of 2.3 μsec of the prior art structure shown in FIG. 8. The passband of 3 dB is 350 kHz in the present example and also in the prior art structure. At 71 MHz±400 kHz which is an adjacent channel frequency, attenuation exceeding 35 dB and high selectivity characteristics are obtained from the present example (FIG. 4) as compared to the prior art structure (FIG. 7).

Figure 10:
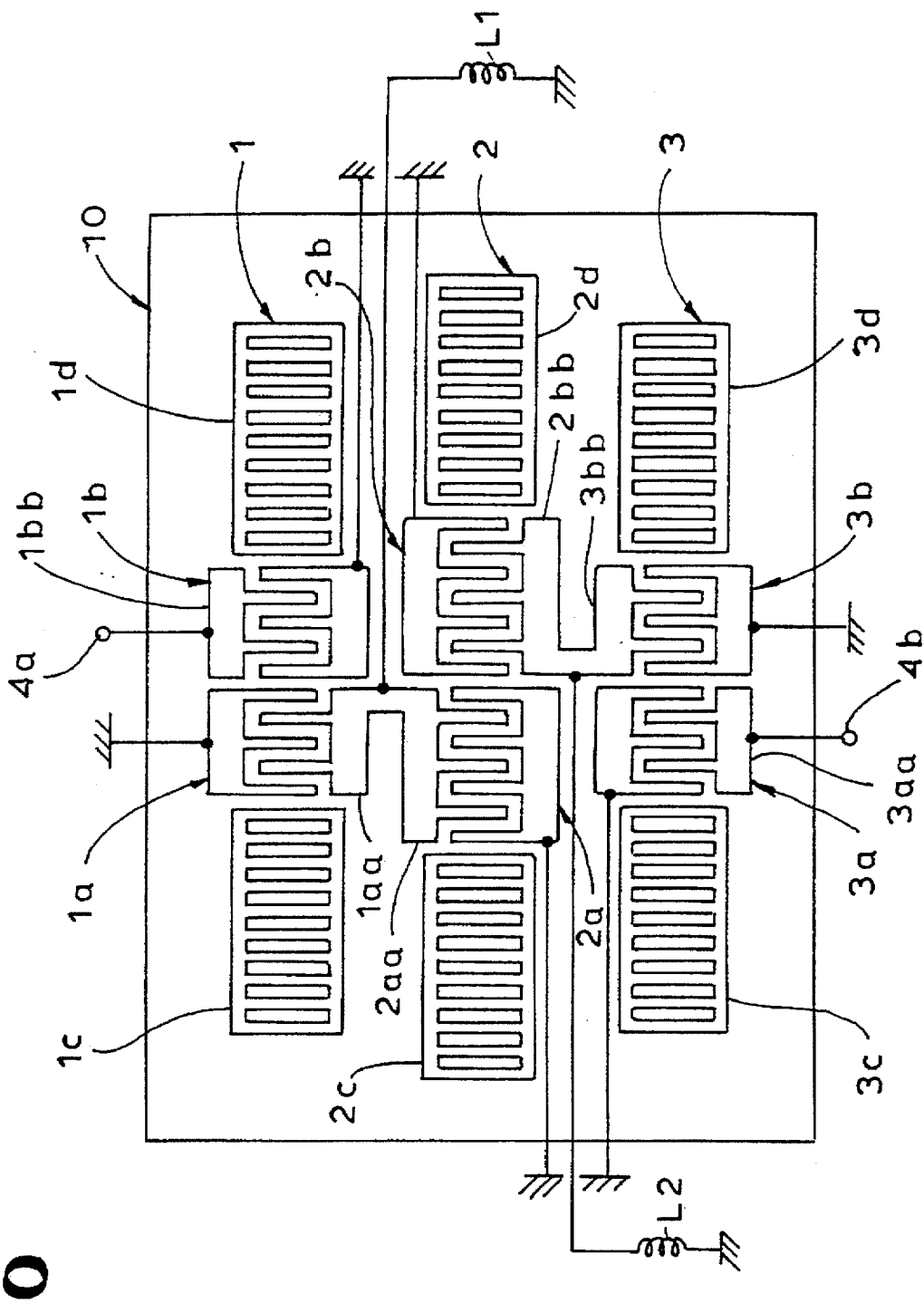
FIG. 10 is a schematic plan view of electrodes of a three-section cascade-connected SAW resonator filter according to a second embodiment of the present invention.
Figure 11:
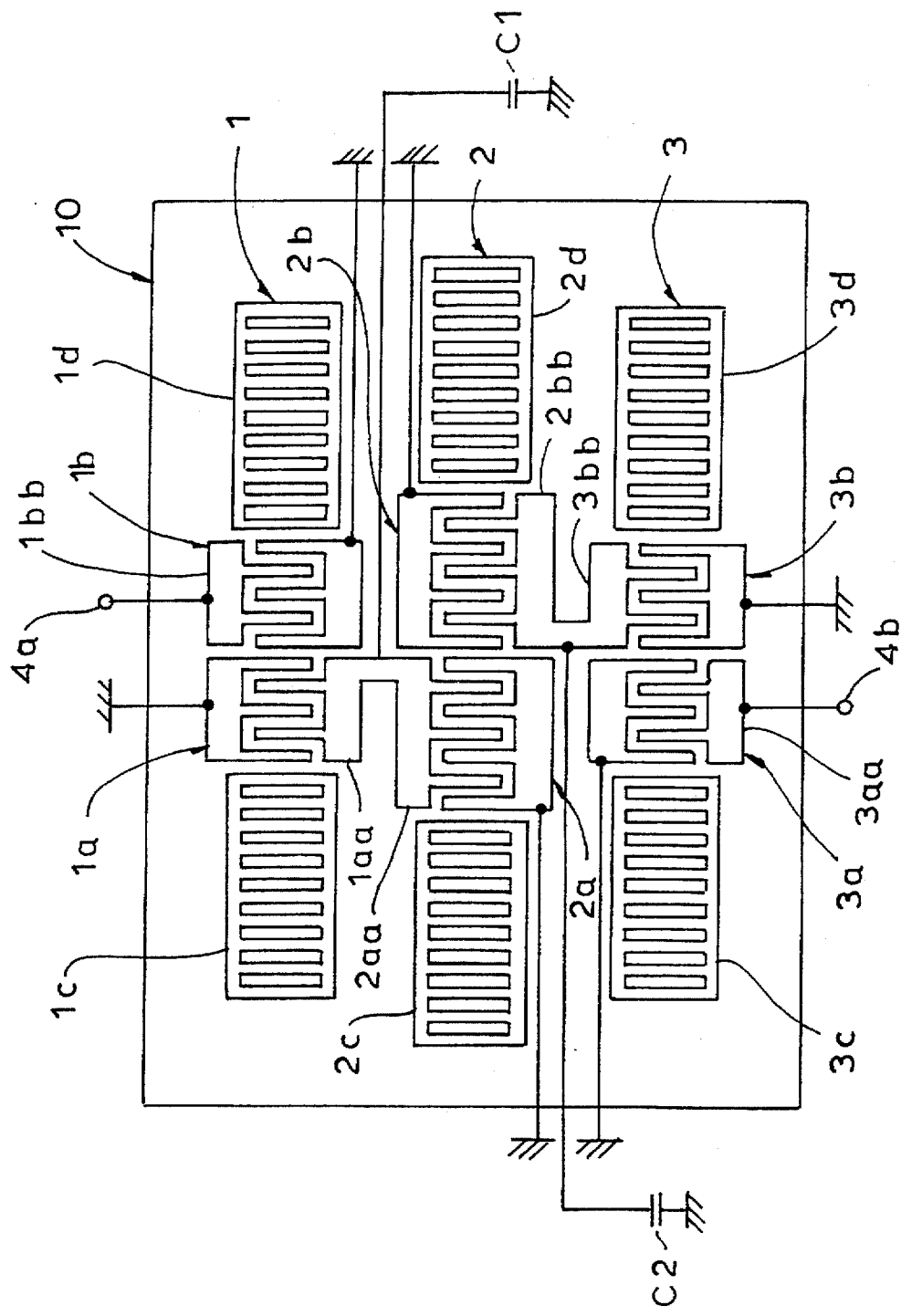
FIG. 11 is a schematic plan view of electrodes of a three-section cascade-connected SAW resonator filter according to a third embodiment of the present invention.

In the above examples, each resonator filter section is composed of two sets of interdigital electrodes. Each filter section may have more than two sets of interdigital electrodes. If the number of sets of interdigital electrodes is increased, vertical higher-order modes can be utilized. In consequence, a surface acoustic-wave resonator filter of a wider bandwidth can be constructed.

Where a wider-band surface acoustic-wave resonator filter is desired to be constructed, as shown in FIG. 10, inductors L1 and L2 are interposed between the adjacent resonator filter sections and electrically connected in parallel with the adjacent filter sections. Conversely, where a narrower-band surface acoustic-wave resonator filter is desired to be built, as shown in FIG. 11, capacitors C1 and C2 are interposed between the adjacent resonator filter sections and electrically connected in parallel with these adjacent filter sections.

In the present example of surface acoustic-wave resonator filter, three resonator filter sections are connected in cascade. The present invention can also be applied to surface acoustic-wave resonator filters where 2, 4, or another number of resonator filter sections are connected in cascade.

Figure 12:
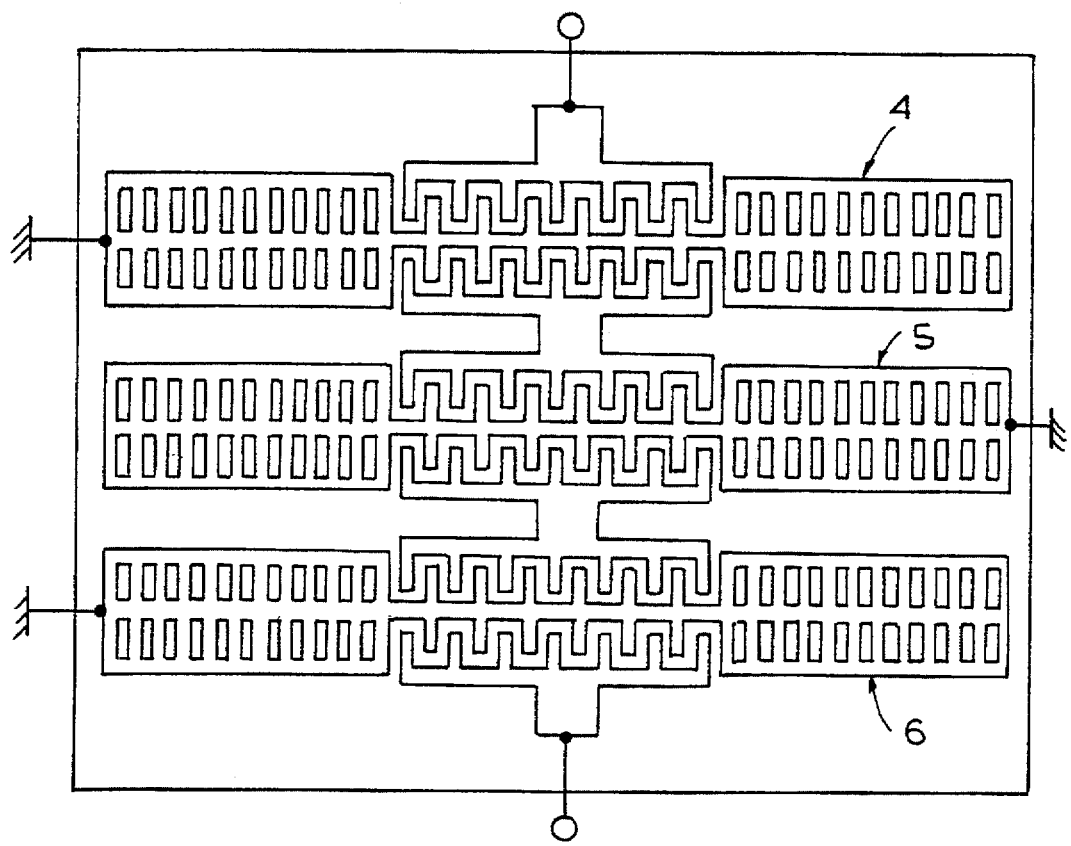
FIG. 12 is a schematic plan view of electrodes of a three-section cascade-connected SAW resonator filter according to a fourth embodiment of the present invention.
Figure 13:
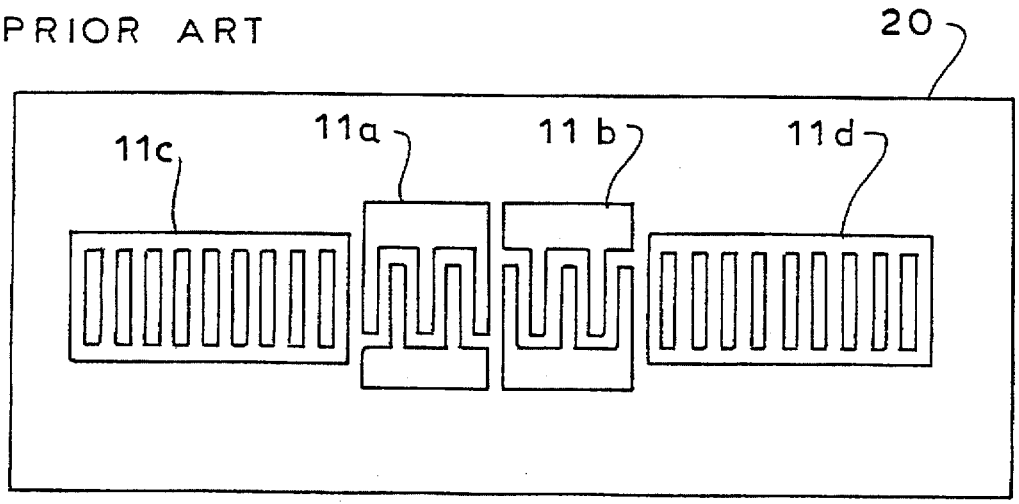
FIG. 13 is a schematic plan view of one section which forms part of a prior art SAW resonator filter.

The invention is also applicable to a surface acoustic-wave resonator filter, as shown in FIG. 12, in which transversely coupled resonator filter sections 4, 5, and 6 are connected in cascade to obtain a desired passband, using the frequency difference described above, between oscillation modes in mutually intersecting lateral directions.

In the present example, at least two resonator filter sections are connected in cascade to construct a surface acoustic-wave resonator filter. One frequency in a lower-frequency oscillation mode of the second resonator filter section is positioned on the lower-frequency side of one frequency in a lower-frequency oscillation mode of the first resonator filter. Alternatively, one frequency in a higher-frequency oscillation mode of the second resonator filter section is placed on the higher-frequency side of one frequency in the higher-frequency oscillation mode of the first resonator filter. Consequently, the group delay time characteristics are improved at lower or higher frequencies, respectively, within the passband. This improves the production yield. Also, a small-sized, low-loss, high-selectivity surface acoustic-wave resonator filter can be obtained.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A surface acoustic-wave resonator filter comprising at least a first energy-confined surface acoustic-wave resonator filter section and a second energy-confined surface acoustic-wave resonator filter section which are connected in cascade on a piezoelectric substrate, each of said resonator filter sections having reflector electrodes disposed on opposite sides of at least two sets of interdigital electrodes, each of said resonator filter sections having a passband determined by a difference between a frequency in a higher-frequency oscillation mode and a frequency in a lower-frequency oscillation mode, said frequency in said lower-frequency oscillation mode of said second resonator filter section being placed on a lower frequency side of said frequency in said lower-frequency oscillation mode of said first resonator filter section, and said frequency in said higher-frequency oscillation mode of said second resonator filter section being placed on a higher frequency side of said frequency in said higher-frequency oscillation mode of said first resonator filter section.

2. The surface acoustic-wave resonator filter of claim 1, wherein said energy-confined surface acoustic-wave resonator filter sections connected in cascade are vertically coupled.

3. The surface acoustic-wave resonator filter of claim 1, wherein said energy-confined surface acoustic-wave resonator filter sections connected in cascade are transversely coupled.

4. The surface acoustic-wave resonator filter of claim 1, further comprising a reactance element interposed between said first resonator filter section and said second resonator filter section and electrically connected in parallel therewith.

5. The surface acoustic-wave resonator filter of claim 4, wherein said reactance element is an inductor.

6. The surface acoustic-wave resonator filter of claim 4, wherein said reactance element is a capacitor.

7. A surface acoustic-wave resonator filter comprising at least a first energy-confined surface acoustic-wave resonator filter section and a second energy-confined surface acoustic-wave resonator filter section which are connected in cascade on a piezoelectric substrate, each of said resonator filter sections having reflector electrodes disposed on opposite sides of at least two sets of interdigital electrodes, each of said resonator filter sections having a passband determined by a difference between a frequency in a higher-frequency oscillation mode and a frequency in a lower-frequency oscillation mode of that resonator filter section, and said frequency in said lower-frequency oscillation mode of said second resonator filter section being placed on a lower frequency side of said frequency in said lower-frequency oscillation mode of said first resonator filter section, said frequency in said higher-frequency oscillation mode of said second resonator filter section being placed on a lower frequency side of said frequency in said higher-frequency oscillation mode of said first resonator filter section.

8. A surface acoustic-wave resonator filter comprising at least a first energy-confined surface acoustic-wave resonator filter section and a second energy-confined surface acoustic-wave resonator filter section which are connected in cascade on a piezoelectric substrate, each of said resonator filter sections having reflector electrodes disposed on opposite sides of at least two sets of interdigital electrodes, each of said resonator filter sections having a passband determined by a difference between a frequency in a higher-frequency oscillation mode and a frequency in a lower-frequency oscillation mode of that resonator filter section, and said frequency in said higher-frequency oscillation mode of said second resonator filter section being placed on a higher frequency side of said frequency in said higher-frequency oscillation mode of said first resonator filter section, said frequency in said lower-frequency oscillation mode of said second resonator filter section being placed on a higher frequency side of said frequency in said lower-frequency oscillation mode of said first resonator filter section.

* * * * *